(12) United States Patent
Yoneji et al.

(10) Patent No.: US 9,753,594 B2
(45) Date of Patent: Sep. 5, 2017

(54) ELECTROSTATIC CAPACITANCE OPERATION DEVICE FABRICATION METHOD, OPERATION PANEL, AND ELECTROSTATIC CAPACITANCE OPERATION DEVICE

(71) Applicant: SUMITOMO WIRING SYSTEMS, LTD., Yokkaichi, Mie (JP)

(72) Inventors: Osamu Yoneji, Yokkaichi (JP); Satoru Chaen, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 314 days.

(21) Appl. No.: 14/759,059

(22) PCT Filed: Nov. 8, 2013

(86) PCT No.: PCT/JP2013/006586
§ 371 (c)(1),
(2) Date: Jul. 2, 2015

(87) PCT Pub. No.: WO2014/111989
PCT Pub. Date: Jul. 24, 2014

(65) Prior Publication Data
US 2015/0346871 A1     Dec. 3, 2015

(30) Foreign Application Priority Data
Jan. 18, 2013   (JP) .................. 2013-007317

(51) Int. Cl.
*G06F 3/044* (2006.01)
*H03K 17/96* (2006.01)
(Continued)

(52) U.S. Cl.
CPC .......... *G06F 3/044* (2013.01); *G06F 3/03547* (2013.01); *H03K 17/962* (2013.01);
(Continued)

(58) Field of Classification Search
CPC ................ G06F 3/03547; G06F 3/044; G06F 2203/04103; H03K 17/962;
(Continued)

(56) References Cited

U.S. PATENT DOCUMENTS

2002/0153840 A1   10/2002   Isohata et al.
2011/0069022 A1    3/2011   Yokota et al.

FOREIGN PATENT DOCUMENTS

| JP | 2002-323863 A | 11/2002 |
| JP | 2009-111996 A | 5/2009 |
| JP | 2011-064658 A | 3/2011 |

OTHER PUBLICATIONS

Feb. 4, 2014 International Search Report issued in International Application No. PCT/JP2013/006586.

*Primary Examiner* — Carson Gross
(74) *Attorney, Agent, or Firm* — Oliff PLC

(57) ABSTRACT

A method for manufacturing a capacitive operation device includes the steps of: preparing a capacitance sensing member including a base film, a sensing electrode formed on the base film, a cover film, and an adhesive layer; preparing an operation panel having a recessed portion having a shape that overlaps an outer edge of the sensing electrode in a stacking direction of the operation panel and the capacitance sensing member; disposing the operation panel and the capacitance sensing member so as to face each other; and bonding the capacitance sensing member to the back surface of the operation panel by pressing the capacitance sensing member against the back surface of the operation panel. In the bonding step, the capacitance sensing member and the operation panel are bonded together while a gas therebetween is being directed to the recessed portion.

6 Claims, 4 Drawing Sheets

(51) Int. Cl.
  *G06F 3/0354* (2013.01)
  *B29C 65/00* (2006.01)
  *B32B 37/00* (2006.01)

(52) U.S. Cl.
  CPC .......... *B29C 66/342* (2013.01); *B29C 66/345* (2013.01); *B29C 66/81457* (2013.01); *B32B 37/003* (2013.01); *G06F 2203/04103* (2013.01); *H01H 2231/032* (2013.01); *H03K 2217/96023* (2013.01); *H03K 2217/960755* (2013.01); *Y10T 156/10* (2015.01)

(58) Field of Classification Search
  CPC ........ H03K 2217/960755; H03K 2217/96023; B32B 37/0007; B32B 37/003; B29C 66/342; B29C 66/345; B29C 66/81; B29C 66/81457; B29C 66/81421; B29C 66/81422; B29C 66/81423
  See application file for complete search history.

ELECTROSTATIC CAPACITANCE
OPERATION DEVICE FABRICATION
METHOD, OPERATION PANEL, AND
ELECTROSTATIC CAPACITANCE
OPERATION DEVICE

This application is a national stage application of PCT/JP2013/006586, international filing date Nov. 8, 2013, and claims priority to JP 2013-007317, filed in Japan on Jan. 18, 2013, the entire disclosures of which are hereby incorporated by reference in their entirety.

BACKGROUND

The present invention relates to a method for manufacturing a capacitive operation device for use in the operation of an electronic device included in a vehicle or the like.

Traditionally, capacitive operation devices are known as operation devices for operating electronic devices. For example, JP 2009-111996A discloses a capacitive operation device including an operation panel including an operated portion operated by an operator and an electrode film disposed on the back surface of the operation panel. The electrode film includes a sensing electrode. The capacitance between the sensing electrode and the operated portion varies according to the distance between the sensing electrode and the operated portion. The electrode film is attached to the back surface of the operation panel with an adhesive in a state in which the sensing electrode overlaps the operated portion in a direction in which the operation panel and the electrode film are placed on top of each other.

At the time of manufacturing a capacitive operation device as described in JP 2009-111996A, or in other words, at the time of bonding the electrode film to the back surface of the operation panel, bubbles may be introduced therebetween. If the operated portion is operated when such bubbles are interposed between the sensing electrode and the operated portion, that operation may not be detected. Specifically, the distance between the sensing electrode and the operated portion when bubbles are interposed between the sensing electrode and the operated portion is greater than that when no bubble is interposed therebetween. Accordingly, in a state in which bubbles are interposed between the sensing electrode and the operated portion, the rate of change in the capacitance between the operated portion and the sensing electrode when the operated portion is operated is reduced. Consequently, the operation of the operated portion may not be detected accurately. Meanwhile, it is very difficult to prevent introduction of bubbles between the sensing electrode and the operated portion at the time of manufacturing such a capacitive operation device.

SUMMARY

It is an object of the preferred embodiments to provide a method for manufacturing a capacitive operation device capable of suppressing introduction of bubbles between the sensing electrode and the operated portion, and an operation panel used for the capacitive operation device.

A method for manufacturing a capacitive operation device according to an aspect of the preferred embodiments is directed to a method for manufacturing a capacitive operation device including: an operation panel having a front surface including an operated portion operated by an operator and a back surface opposite the front surface; and a capacitance sensing member disposed on the back surface of the operation panel, the method including: a sensing member preparing step of preparing the capacitance sensing member including: a base film; a sensing electrode formed on the base film, the sensing electrode being configured such that a capacitance between the sensing electrode and the operated portion varies according to a distance between the sensing electrode and the operated portion; a cover film having a shape that covers the sensing electrode; and an adhesive layer provided on the cover film at least in a portion corresponding to the sensing electrode; an operation panel preparing step of preparing the operation panel having a recessed portion recessed from the back surface of the operation panel toward the front surface thereof, the recessed portion having a shape that overlaps an outer edge of the sensing electrode in a stacking direction in which the operation panel and the capacitance sensing member are placed on top of each other; a disposing step of disposing the operation panel and the capacitance sensing member so as to face each other in an orientation in which the operated portion and the sensing electrode overlap in the stacking direction and the adhesive layer faces toward the back surface of the operation panel; and a bonding step of bonding the capacitance sensing member to the back surface of the operation panel by pressing the capacitance sensing member against the back surface of the operation panel so as to direct a gas between the capacitance sensing member and the operation panel to the recessed portion.

An operation panel according to another aspect of the preferred embodiments is directed to an operation panel having a front surface including an operated portion operated by an operator and a back surface opposite the front surface, the operation panel being configured such that a capacitance sensing member including a sensing electrode in which a capacitance between the sensing electrode and the operated portion varies according to a distance between the sensing electrode and the operated portion can be bonded to the back surface, the operation panel having a recessed portion recessed from the back surface toward the front surface, the recessed portion having a shape that overlaps an outer edge of the sensing electrode in a stacking direction in which the operation panel and the capacitance sensing member are placed on top of each other when the capacitance sensing member is stacked on a back side of the operation panel.

A capacitive operation device according to another aspect of the preferred embodiments is directed to a capacitive operation device including: the above-described operation panel; and the capacitance sensing member that is bonded to the back surface of the operation panel in an orientation in which the outer edge of the sensing electrode overlaps the recessed portion in the stacking direction.

As described above, according to the preferred embodiments, it is possible to provide a method for manufacturing a capacitive operation device capable of suppressing introduction of bubbles between the sensing electrode and the operated portion, and an operation panel used for the capacitive operation device.

DETAILED DESCRIPTION OF EMBODIMENTS

A capacitive operation device and a manufacturing method thereof according to an embodiment will be described with reference to FIGS. 1 to 4.

The capacitive operation device of the present embodiment includes an operation panel 10 operated by an operator and a capacitance sensing member 20 disposed on the back surface of the operation panel 10.

Figure 1:
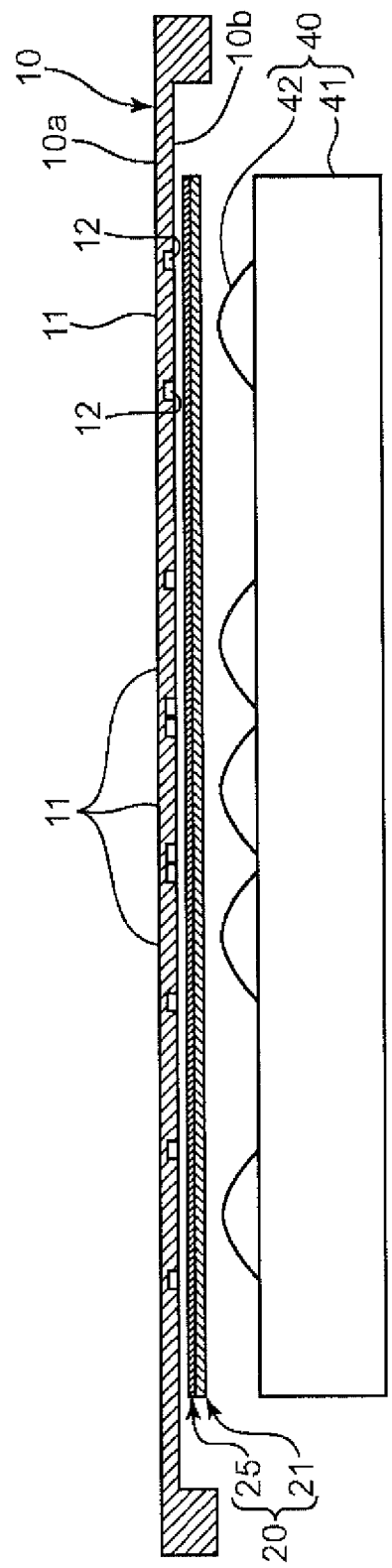
FIG. 1 is a cross-sectional view showing a state before a capacitance sensing member is bonded to an operation panel in a manufacturing step of a capacitive operation device according to an embodiment.
Figure 2:
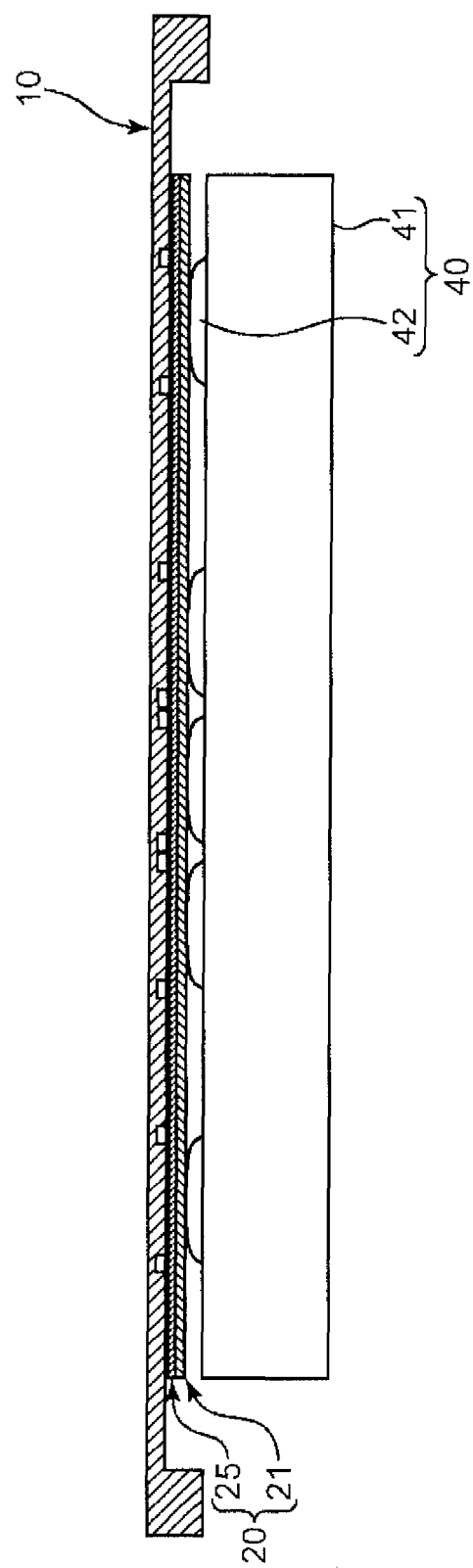
FIG. 2 is a cross-sectional view showing a state in which the capacitance sensing member is being bonded to the operation panel in the manufacturing step of the capacitive operation device shown in FIG. 1.
Figure 3:
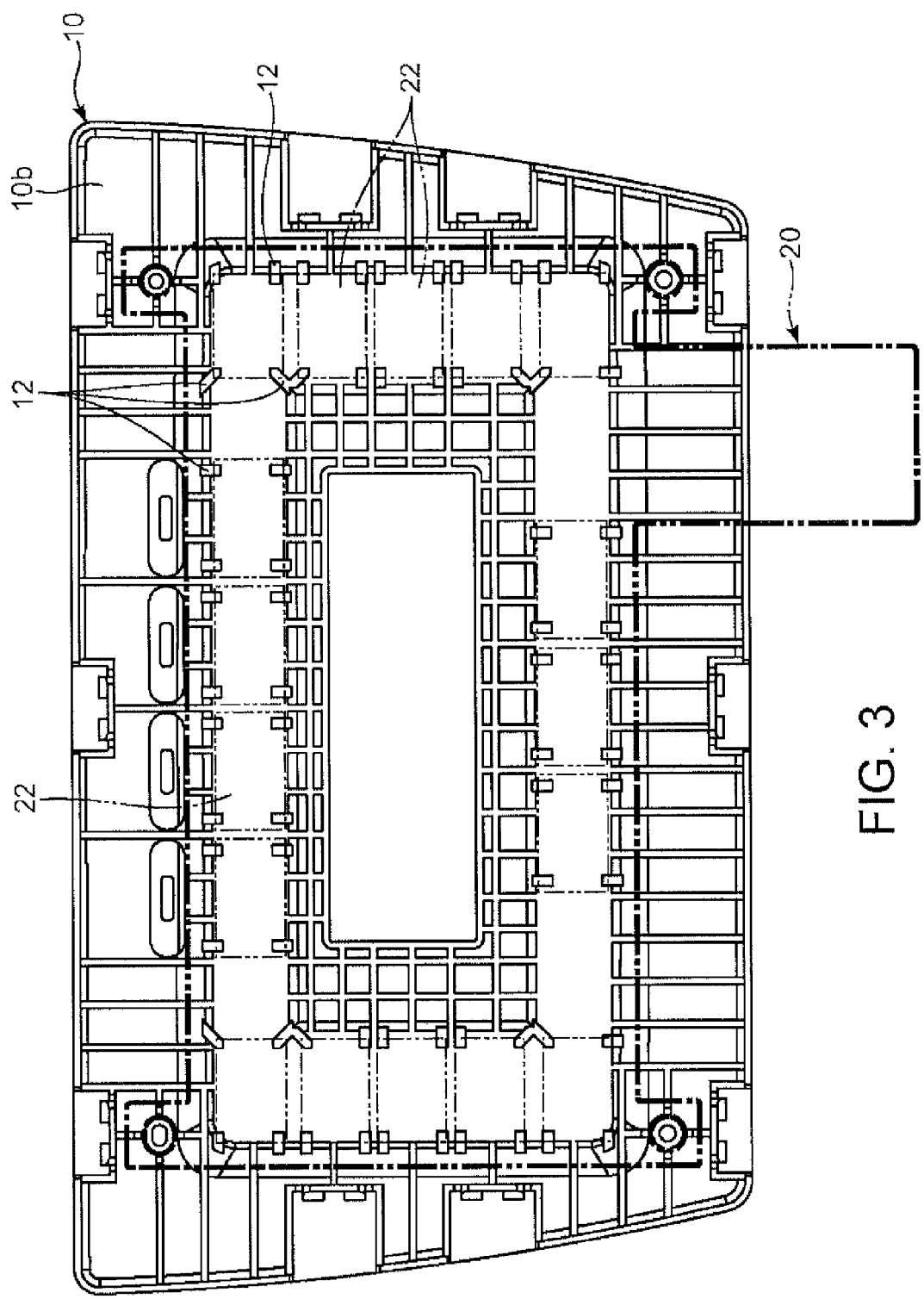
FIG. 3 is a rear view of the operation panel.

As shown in FIGS. 1 to 3, the operation panel 10 is a substantially rectangular panel having a front surface 10a and a back surface 10b. The operation panel 10 includes operated portions 11 that are formed on the front surface 10a and are operated by the operator's finger or the like, and recessed portions 12 recessed from the back surface 10b toward the front surface 10a.

The operated portions 11 are portions where an operation of touching with the operator's finger or the like (touch operation) is performed. The operated portions 11 are formed in a plurality of locations of the front surface 10a of the operation panel 10. The recessed portions 12 are formed at portions of the back surface 10b of the operation panel 10 that correspond to the operated portions 11.

The capacitance sensing member 20 includes a capacitance sensing film 21 and an adhesive layer 25 formed on the front surface of the capacitance sensing film 21. The capacitance sensing film 21 includes a base film (not shown), sensing electrodes 22 (see FIG. 3) formed on the base film, and a cover film (not shown) for protecting the sensing electrodes 22. Note that each of the base film and the cover film is formed of a transparent resin such as PET. In FIG. 3, in order to illustrate the correspondence between the capacitance sensing member 20 and the operation panel 10, the outside shape of the capacitance sensing member 20 and the outside shape of the sensing electrodes 22 are indicated by dashed double-dotted lines.

The sensing electrodes 22 are formed on the base film by printing or the like. Each sensing electrode 22 is made of a transparent material such as ITO. The capacitance between the sensing electrode 22 and the operated portion 11 varies according to the distance between the sensing electrode 22 and the operated portion 11. The sensing electrode 22 is provided at a position that overlaps the operated portion 11 in a stacking direction in which the operation panel 10 and the capacitance sensing member 20 are placed on top of each other.

Here, each recessed portion 12 of the operation panel 10 has a shape that overlaps the outer edge of the sensing electrode 22 in the stacking direction in a state in which the capacitance sensing member 20 and the operation panel 10 are placed on top of each other in the stacking direction. In the present embodiment, as shown in FIG. 3, the recessed portion 12 has a shape that straddles a portion of the back surface 10b of the operation panel 10 that overlaps the outer edge of the sensing electrode 22 in the stacking direction. However, the recessed portion 12 does not need to have a shape straddling the above-described portion. In the present embodiment, the sensing electrode 22 is rectangular, and the recessed portions 12 are formed at positions of the back surface 10b of the operation panel 10 that overlap the four corners of the sensing electrode 22 in the stacking direction. However, the positions where the recessed portions 12 are formed are not limited to the above-described four corners, as long as they are positions that overlap the outer edge of the sensing electrode 22 in the stacking direction. Also, the recessed portion 12 may be formed at least one location that overlaps the outer edge of the sensing electrode 22 in the stacking direction.

The adhesive layer 25 is provided at at least positions on the cover film that correspond to the sensing electrodes 22. In the present embodiment, the adhesive layer 25 is formed on the entire region of the front surface of the cover film. Examples of the adhesive layer 25 include a double-sided tape.

Next, a method for manufacturing the capacitive operation device will be described with reference to FIGS. 1 and 2. The method for manufacturing the present embodiment includes a sensing member preparing step of preparing the capacitance sensing member 20, an operation panel preparing step of preparing the operation panel 10, a disposing step of disposing the capacitance sensing member 20 and the operation panel 10 so as to face each other, and a bonding step of bonding the capacitance sensing member 20 to the back surface of the operation panel 10.

In the disposing step, the operation panel 10 and the capacitance sensing member 20 are disposed in an orientation in which the back surface of the operated portion 11 in the operation panel 10 and the sensing electrodes 22 overlap in the stacking direction and the adhesive layer 25 faces toward the back surface 10b of the operation panel 10. More specifically, the operation panel 10 and the capacitance sensing member 20 are disposed in an orientation in which each recessed portion 12 straddles a portion of the back surface 10b of the operation panel 10 that overlaps the outer edge of the sensing electrode 22 in the stacking direction.

Figure 4:
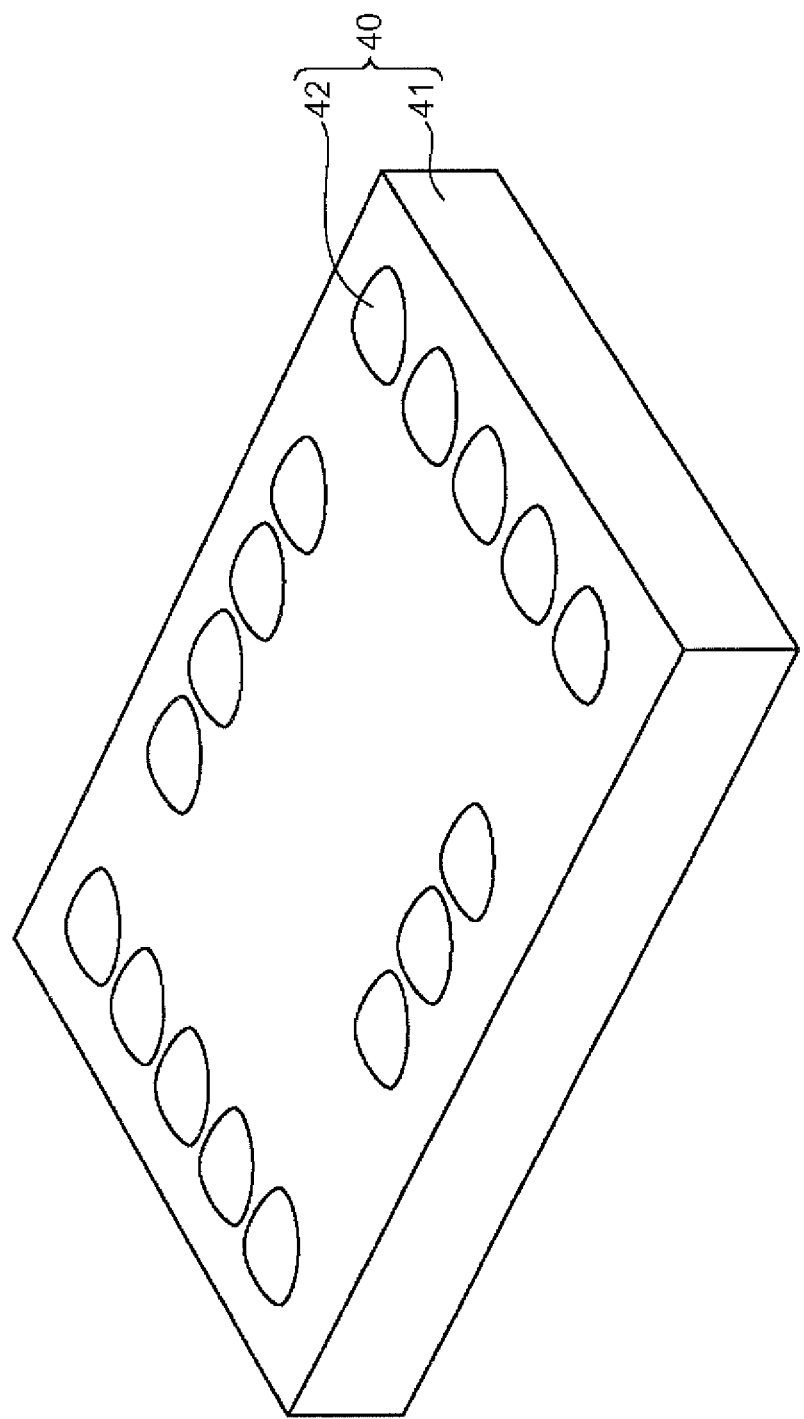
FIG. 4 is a perspective view of a jig used in the manufacturing step of the capacitive operation device shown in FIG. 1.

In the bonding step, the capacitance sensing member 20 and the operation panel 10 are bonded together while the gas therebetween is being directed to the recessed portions 12. A jig 40 shown in FIG. 4 is used in the bonding step of the present embodiment. The jig 40 includes a jig body 41 having a substantially rectangular parallelepiped shape, and deformation portions 42 formed on the front surface of the jig body 41. At least the deformation portions 42 of the jig 40 are formed of an elastically deformable resin such as silicone. Each deformation portion 42 is elastically deformed so as to direct the above-described gas to the recessed portions 12 when being pressed toward the back surface 10b of the operation panel 10 via the capacitance sensing member 20 in an orientation in which the deformation portion 42 and the sensing electrode 22 overlap in the stacking direction (see FIG. 2). The deformation portion 42 has a shape in which its dimension in the stacking direction decreases outward from its center, or in other words, a shape in which the amount of its projection from the jig body 41 increases toward its center.

In the bonding step, the capacitance sensing member 20 is pressed against the back surface 10b of the operation panel 10 by using the jig 40 in an orientation in which the central portion of the deformation portion 42 overlaps the central portion of the sensing electrode 22 in the stacking direction. At this time, the top portion, which is the central portion, of the deformation portion 42 first comes into contact with a portion of the back surface of the base film that corresponds to the central portion of the sensing electrode 22. Thereafter, the deformation portion 42 presses the capacitance sensing member 20 against the back surface 10b of the operation panel 10 while being elastically deformed in a direction in which it becomes flat so as to push the gas outwardly toward the recessed portions 12 located around the top portion, thereby bonding the capacitance sensing member 20 to the back surface 10b of the operation panel 10 and moving the gas to the recessed portions 12.

As described above, with the method for manufacturing the capacitive operation device of the present embodiment, in the bonding step, the capacitance sensing member 20 and the operation panel 10 are bonded together while the gas therebetween is being directed to the recessed portion 12 located at a position overlapping the outer edge of the sensing electrode 22 in the stacking direction, and therefore, introduction of bubbles between the operated portion 11 and the center region of the sensing electrode 22 is suppressed, resulting in higher adhesion between the operated portion 11 and the center region of the sensing electrode 22. Usually, a portion of the operated portion 11 that overlaps the center region of the sensing electrode 22 in the stacking direction receives a touch operation, and therefore, improved adhesion between the center region of the sensing electrode 22 and the operation panel 10 results in improved sensing accuracy.

Furthermore, since the jig 40 including the deformation portion 42 is used in the bonding step, it is easy to bond the capacitance sensing member 20 to the back surface 10b of the operation panel 10 while directing the gas to the recessed portions 12. Specifically, when the jig 40 is pressed against the back surface 10b of the operation panel 10 in the bonding step, the deformation portion 42 is elastically deformed so as to direct the gas to the recessed portions 12, and thereby, the gas is accommodated in the recessed portion 12. Accordingly, introduction of bubbles between the center region of the sensing electrode 22 and the operation panel 10 is suppressed by a simple step of pressing the capacitance sensing member 20 against the back surface 10b of the operation panel 10 by using the jig 40.

Each deformation portion 42 has a shape in which the amount of its projection from the jig body 41 increases toward its center. When the deformation portion 42 is pressed against the back surface 10b of the operation panel 10, the deformation portion 42 first comes into contact with the center region of the sensing electrode 22, and is thereafter elastically deformed so as to push the gas outwardly from the center region toward the recessed portion 12 located outward of the center region, thus readily suppressing introduction of bubbles between the center region and the operation panel 10.

Since the recessed portion 12 of the operation panel 10 has a shape that straddles a portion of the back surface 10b of the operation panel 10 that overlaps the outer edge of the sensing electrode 22 in the stacking direction, the bubbles also reach the outside of the outer edge of the sensing electrode 22 when the capacitance sensing member 20 is bonded to the back surface 10b of the operation panel 10 in the bonding step. Consequently, the adhesion between the sensing electrode 22 and the operated portion 11 is further improved.

With the use of the operation panel 10, the adhesion between the center region of the sensing electrode 22 and the operation panel 10 is improved by bonding the capacitance sensing member 20 to the back surface 10b of the operation panel 10 while directing the gas between the capacitance sensing member 20 and the operation panel 10 to the recessed portions 12 at the time of bonding the capacitance sensing member 20 to the back surface 10b of the operation panel 10. Consequently, a capacitive operation device having high sensing accuracy is readily manufactured.

It should be understood that the embodiment disclosed herein is in all respects illustrative and not restrictive. The scope of the present invention is defined by the claims, rather than the description of the embodiment above, and is intended to include all modifications which fall within the scope of the claims and the meaning and scope of equivalents thereof. The present invention is not limited to the embodiments discussed herein.

For example, in the bonding step of the above embodiment, the jig 40 including the deformation portion 42 is used at the time of pressing the capacitance sensing member 20 against the operation panel 10. However, any means other than the jig 40 may be used to press the capacitance sensing member 20 against the operation panel 10 and bond them together, as long as it is capable of directing the gas between the capacitance sensing member 20 and the operation panel 10 to the recessed portion 12. For example, a simple rod-shaped jig or a finger may be pressed against the center region of the sensing electrode 22, and the jig or the finger may be slid outwardly from the center region to send the bubbles to the recessed portion 12. However, the use of the jig 40 including the deformation portion 42 enables the gas to be sent to the recessed portion 12 by simply pressing the jig 40 toward the back surface 10b of the operation panel 10 via the capacitance sensing member 20 by utilizing the elastic deformation of the deformation portion 42, without involving any complex operation.

The deformation portion 42 is not limited to a deformation portion that is elastically deformed so as to push the gas from the center region of the sensing electrode 22 toward the recessed portion 12 located outward the center region as in the above embodiment, as long as it is elastically deformed so as to direct the gas to the recessed portion 12 when being pressed against the back surface 10b of the operation panel 10. For example, the deformation portion 42 may be a deformation portion that is elastically deformed so as to direct the gas to the recessed portion 12 from the side opposite to the side on which the recessed portion 12 is located when being pressed against the back surface 10b of the operation panel 10.

Here, the embodiment that has been described thus far will be summarized.

The method for manufacturing the capacitive operation device according to the present embodiment is a method for manufacturing a capacitive operation device including: an operation panel having a front surface including an operated portion operated by an operator and a back surface opposite the front surface; and a capacitance sensing member disposed on the back surface of the operation panel, the method including: a sensing member preparing step of preparing the capacitance sensing member including: a base film; a sensing electrode formed on the base film, the sensing electrode being configured such that a capacitance between the sensing electrode and the operated portion varies according to a distance between the sensing electrode and the operated portion; a cover film having a shape that covers the sensing electrode; and an adhesive layer provided on the cover film at least in a portion corresponding to the sensing electrode; an operation panel preparing step of preparing the operation panel having a recessed portion recessed from the back surface of the operation panel toward the front surface thereof, the recessed portion having a shape that overlaps an outer edge of the sensing electrode in a stacking direction in which the operation panel and the capacitance sensing member are placed on top of each other; a disposing step of disposing the operation panel and the capacitance sensing member so as to face each other in an orientation in which the operated portion and the sensing electrode overlap in the stacking direction and the adhesive layer faces toward the back surface of the operation panel; and a bonding step of bonding the capacitance sensing member to the back surface of the operation panel by pressing the capacitance sensing member against the back surface of the operation panel so as to direct a gas between the capacitance sensing member and the operation panel to the recessed portion.

With this manufacturing method, in the bonding step, the capacitance sensing member and the operation panel are bonded together while the gas therebetween is being directed to the recessed portion located at a position overlapping the outer edge of the sensing electrode in the stacking direction, and therefore, interposition of bubbles between the operated portion and the center region of the sensing electrode is suppressed, resulting in higher adhesion between the operated portion and the center region of the sensing electrode. Usually, a portion of the operated portion that overlaps the center region of the sensing electrode is operated, and therefore, improved adhesion between the center region of the sensing electrode and the operation panel results in improved sensing accuracy.

Specifically, it is preferable that, in the bonding step, a jig including a deformation portion that is elastically deformed and being capable of pressing the capacitance sensing member toward the back surface of the operation panel is used, the deformation portion being configured to be elastically deformed so as to direct the gas to the recessed portion when being pressed toward the back surface of the operation panel via the capacitance sensing member in an orientation in which the deformation portion and the sensing electrode overlap in the stacking direction, and the deformation portion is elastically deformed by pressing the capacitance sensing member against the back surface of the operation panel by using the jig in an orientation in which the deformation portion overlaps the sensing electrode in the stacking direction, thereby bonding the capacitance sensing member to the back surface of the operation panel while directing the gas to the recessed portion.

By doing so, introduction of bubbles between the center region of the sensing electrode and the operation panel is suppressed by a simple step of pressing the capacitance sensing member against the back surface of the operation panel by using the jig. Specifically, when the jig is pressed against the back surface of the operation panel in the bonding step, the deformation portion is elastically deformed so as to direct the gas to the recessed portion, and thereby, the gas is accommodated in the recessed portion. Accordingly, introduction of bubbles between the center region of the sensing electrode and the operation panel is suppressed.

In this case, it is preferable that, in the bonding step, a jig is used that includes a deformation portion having a shape in which the deformation portion is elastically deformed so as to direct the gas from the center region of the sensing electrode to the recessed portion when being pressed toward the back surface of the operation panel via the capacitance sensing member.

By doing so, when the jig is pressed toward the back surface of the operation panel via the capacitance sensing member, the gas is directed from the center region of the sensing electrode to the recessed portion located at a position of the back surface of the operation panel that overlaps the outer edge of the sensing electrode in the stacking direction. Accordingly, interposition of bubbles between the center region and the operation panel is readily suppressed.

In this manufacturing method, it is preferable that, in the operation panel preparing step, the operation panel in which the recessed portion has a shape that straddles a portion of the back surface of the operation panel that overlaps the outer edge of the sensing electrode in the stacking direction is prepared.

By doing so, in the bonding step, the bubbles between the capacitance sensing member and the back surface of the operation panel also reach the outside of the outer edge of the sensing electrode. Accordingly, the adhesion between the sensing electrode and the operated portion is further improved.

The operation panel of the present embodiment is an operation panel having a front surface including an operated portion operated by an operator and a back surface opposite the front surface, the operation panel being configured such that a capacitance sensing member including a sensing electrode in which a capacitance between the sensing electrode and the operated portion varies according to a distance between the sensing electrode and the operated portion can be bonded to the back surface, the operation panel having a recessed portion recessed from the back surface toward the front surface, the recessed portion having a shape that overlaps an outer edge of the sensing electrode in a stacking direction in which the operation panel and the capacitance sensing member are placed on top of each other when the capacitance sensing member is stacked on a back side of the operation panel.

With this operation panel, the adhesion between the center region of the sensing electrode and the operation panel is improved by bonding the capacitance sensing member to the back surface of the operation panel while directing the gas therebetween to the recessed portion at the time of bonding them. Accordingly, a capacitive operation device having high sensing accuracy is readily manufactured.

In this case, it is preferable that the recessed portion has a shape that straddles a portion of the back surface of the operation panel that overlaps the outer edge of the sensing electrode in the stacking direction when the capacitance sensing member is stacked on the back side of the operation panel.

By doing so, it is possible to cause the bubbles between the capacitance sensing member and the back surface of the operation panel to reach the outside of the outer edge of the sensing electrode at the time of bonding together the capacitance sensing member to the back surface of the operation panel. Accordingly, the adhesion between the sensing electrode and the operated portion is further improved.

The capacitive operation device of the present embodiment is a capacitive operation device including: the above-described operation panel; and the capacitance sensing member that is bonded to the back surface of the operation panel in an orientation in which the outer edge of the sensing electrode overlaps the recessed portion in the stacking direction.

The invention claimed is:

1. A method for manufacturing a capacitive operation device including: an operation panel having a front surface including an operated portion operated by an operator and a back surface opposite the front surface; and a capacitance sensing member disposed on the back surface of the operation panel, the method comprising:

a sensing member preparing step of preparing the capacitance sensing member including: a base film; a sensing electrode formed on the base film, the sensing electrode being configured such that a capacitance between the sensing electrode and the operated portion varies according to a distance between the sensing electrode and the operated portion; a cover film having a shape that covers the sensing electrode; and an adhesive layer provided on the cover film at least in a portion corresponding to the sensing electrode;

an operation panel preparing step of preparing the operation panel having a recessed portion recessed from the back surface of the operation panel toward the front surface thereof, the recessed portion having a shape that overlaps an outer edge of the sensing electrode in a stacking direction in which the operation panel and the capacitance sensing member are placed on top of each other;

a disposing step of disposing the operation panel and the capacitance sensing member so as to face each other in an orientation in which the operated portion and the sensing electrode overlap in the stacking direction and the adhesive layer faces toward the back surface of the operation panel; and a bonding step of bonding the capacitance sensing member to the back surface of the operation panel by pressing the capacitance sensing member against the back surface of the operation panel so as to direct a gas between the capacitance sensing member and the operation panel to the recessed portion, wherein in the bonding step, a jig including a deformation portion that is elastically deformed and being capable of pressing the capacitance sensing member toward the back surface of the operation panel is used, the deformation portion being configured to be elastically deformed so as to direct the gas to the recessed portion when being pressed toward the back surface of the operation panel via the capacitance sensing member in an orientation in which the deformation portion and the sensing electrode overlap in the stacking direction, and the deformation portion is elastically deformed by pressing the capacitance sensing member against the back surface of the operation panel by using the jig in the orientation in which the deformation portion and the sensing electrode overlap in the stacking direction, thereby bonding the capacitance sensing member to the back surface of the operation panel while directing the gas to the recessed portion.

2. The method for manufacturing a capacitive operation device according to claim 1, wherein, the deformation portion is elastically deformed so as to direct the gas from a center region of the sensing electrode to the recessed portion when being pressed toward the back surface of the operation panel via the capacitance sensing member.

3. The method for manufacturing a capacitive operation device according to claim 1, wherein, in the operation panel preparing step, the operation panel in which the recessed portion has a shape that straddles a portion of the back surface of the operation panel that overlaps the outer edge of the sensing electrode in the stacking direction is prepared.

4. The method for manufacturing a capacitive operation device according to claim 1, wherein in the bonding step, the orientation in which the deformation portion and the sensing electrode overlap in the stacking direction is such that a central portion of the deformation portion overlaps a central portion of the sensing electrode in the stacking direction.

5. The method for manufacturing a capacitive operation device according to claim 1, wherein in the operation panel preparing step, the operation panel is prepared having a plurality of recessed portions, and in the disposing step, the plurality of recessed portions are disposed overlapping the outer edge of the sensing electrode.

6. The method for manufacturing a capacitive operation device according to claim 1, wherein in the sensing member preparing step, a plurality of sensing electrodes are formed on the base film, and the jig includes a plurality of deformation portions such that, in the bonding step, each of the plurality of deformation portions is disposed overlapping a respective one of the plurality of sensing electrodes in the stacking direction.

\* \* \* \* \*